US012740361B2

(12) United States Patent
Ohashi et al.

(10) Patent No.: US 12,740,361 B2
(45) Date of Patent: Sep. 15, 2026

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Naofumi Ohashi, Toyama (JP); Tomihiro Amano, Toyama (JP); Tomoyuki Miyada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 642 days.

(21) Appl. No.: 18/193,981

(22) Filed: Mar. 31, 2023

(65) Prior Publication Data

US 2024/0047233 A1 Feb. 8, 2024

(30) Foreign Application Priority Data

Aug. 2, 2022 (JP) ................................ 2022-123485

(51) Int. Cl.
*H10P 72/00* (2026.01)

(52) U.S. Cl.
CPC ...... *H10P 72/0402* (2026.01); *H10P 72/0462* (2026.01); *H10P 72/0464* (2026.01); *H10P 72/0466* (2026.01); *H10P 72/0604* (2026.01)

(58) Field of Classification Search
CPC ......... H01L 21/67253; H01L 21/67196; H01L 21/67017; H01L 21/6719; H01L 21/67201;

(Continued)

(56) References Cited

U.S. PATENT DOCUMENTS

2006/0245852 A1 11/2006 Iwabuchi
2007/0107598 A1* 5/2007 Lee .................. H01L 21/67781 55/306

(Continued)

FOREIGN PATENT DOCUMENTS

CN 1841652 A 10/2006
JP 05-017879 U 3/1993

(Continued)

OTHER PUBLICATIONS

Japanese Office Action issued on Jan. 20, 2025 for Japanese Patent Application No. 2022-123485.

(Continued)

*Primary Examiner* — Glenn F Myers
(74) *Attorney, Agent, or Firm* — Volpe Koenig

(57) ABSTRACT

According to the present disclosure, there is provided a technique capable of improving a throughput and suppressing an oxidation of a surface of a substrate and an adhesion of particles to the surface of the substrate. According to one aspect thereof, there is provided a substrate processing apparatus including: a plurality of process chambers; a transfer chamber provided adjacent to the plurality of process chambers and maintained in a decompressed state; a waiting chamber capable of communicating with the transfer chamber in the decompressed state, provided with a plurality of supports capable of supporting a plurality of substrates after a process set for a first process chamber among the plurality of process chambers is completed, and configured such that an inert gas is supplied for every predetermined number of substrates among the plurality of substrates respectively supported by the plurality of supports.

17 Claims, 5 Drawing Sheets

(58) Field of Classification Search
CPC ............. H10P 72/0466; H10P 72/0462; H10P 72/0402; H10P 72/0464; H10P 72/0461; H10P 72/0604
See application file for complete search history.

(56) References Cited

U.S. PATENT DOCUMENTS

| | | | | |
|---|---|---|---|---|
| 2009/0016855 | A1 | 1/2009 | Hofmeister et al. | |
| 2012/0170999 | A1 * | 7/2012 | Sakaue | H01L 21/67739 414/217 |
| 2014/0174357 | A1 | 6/2014 | Kim et al. | |
| 2015/0267291 | A1 | 9/2015 | Yang et al. | |
| 2016/0118282 | A1 | 4/2016 | Maraschin et al. | |
| 2016/0169766 | A1 | 6/2016 | Ishibashi et al. | |
| 2017/0092517 | A1 | 3/2017 | Ohashi et al. | |
| 2020/0020555 | A1 * | 1/2020 | Kim | H01L 21/67201 |
| 2021/0090917 | A1 * | 3/2021 | Weaver | H01L 21/67201 |
| 2023/0386871 | A1 * | 11/2023 | Hara | H01L 21/67109 |

FOREIGN PATENT DOCUMENTS

| | | | |
|---|---|---|---|
| JP | 05-217919 | A | 8/1993 |
| JP | 2007-035874 | A | 2/2007 |
| JP | 2011-503837 | A | 1/2011 |
| JP | 2011-049507 | A | 3/2011 |
| JP | 2014-524659 | A | 9/2014 |
| JP | 2016-086161 | A | 5/2016 |
| JP | 2016-114389 | A | 6/2016 |
| KR | 10-1387519 | B | 4/2014 |
| KR | 10-2017-0038139 | A | 4/2017 |

OTHER PUBLICATIONS

Taiwan Office Action issued on May 27, 2024 for Taiwan Patent Application No. 112117862.

Korean Office Action issued on Jun. 18, 2024 for Korean Patent Application No. 10-2023-0041117.

* cited by examiner

FIG. 4

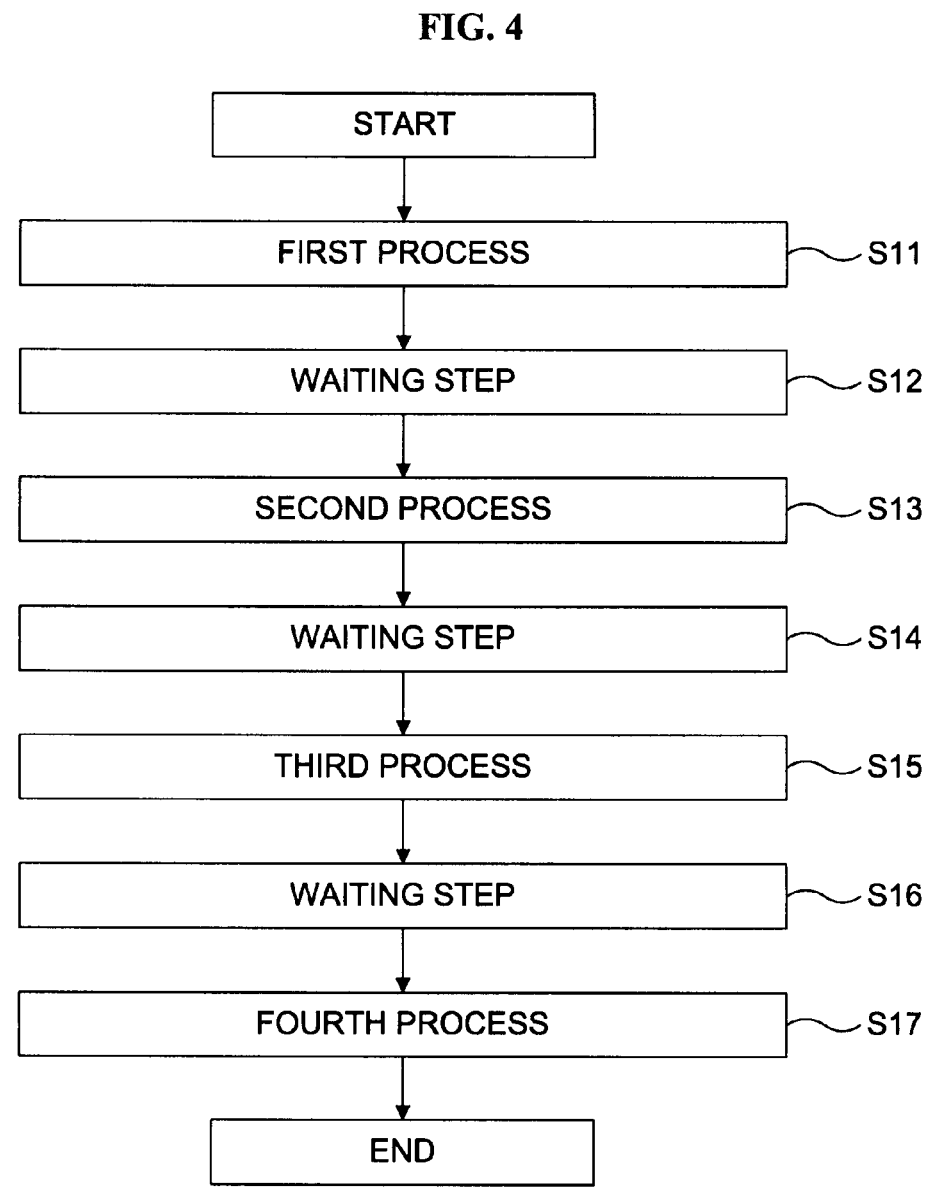

START
FIRST PROCESS S11
WAITING STEP S12
SECOND PROCESS S13
WAITING STEP S14
THIRD PROCESS S15
WAITING STEP S16
FOURTH PROCESS S17
END

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application is based on and claims priority under 35 U.S.C. § 119 of Japanese Patent Application No. 2022-123485 filed on Aug. 2, 2022, in the Japanese Patent Office, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Related Art

As a part of a manufacturing process of a semiconductor device, a plurality of processes may be performed on a substrate by using a plurality of process furnaces.

When the plurality of processes are performed on the substrate by using the plurality of process furnaces as described above, a waiting time (also referred to as a "stand-by time") may occur between a process completed on the substrate and its subsequent process to be performed on the substrate. Further, during the waiting time, a surface of the substrate may be exposed to an outer atmosphere, or particles may adhere to the surface of the substrate.

SUMMARY

According to the present disclosure, there is provided a technique capable of improving a throughput and suppressing an oxidation of a surface of a substrate and an adhesion of particles to the surface of the substrate.

According to an aspect of the technique of the present disclosure, there is provided a substrate processing apparatus including: a plurality of process chambers in which a substrate transferred thereinto is processed, wherein a plurality of processes respectively set in advance for the plurality of process chambers are performed on the substrate; a transfer chamber provided adjacent to the plurality of process chambers and maintained in a decompressed state; a waiting chamber capable of communicating with the transfer chamber in the decompressed state, provided with a plurality of supports capable of supporting a plurality of substrates after a process set for a first process chamber among the plurality of process chambers is completed and configured such that an inert gas is supplied for every predetermined number of substrates among the plurality of substrates respectively supported by the plurality of supports.

BRIEF DESCRIPTION OF THE DRAWINGS

FIG. 4 is a flow chart schematically illustrating an example of a substrate processing according to the embodiments of the present disclosure.

DETAILED DESCRIPTION

<Embodiments of Present Disclosure>

Figure 1:
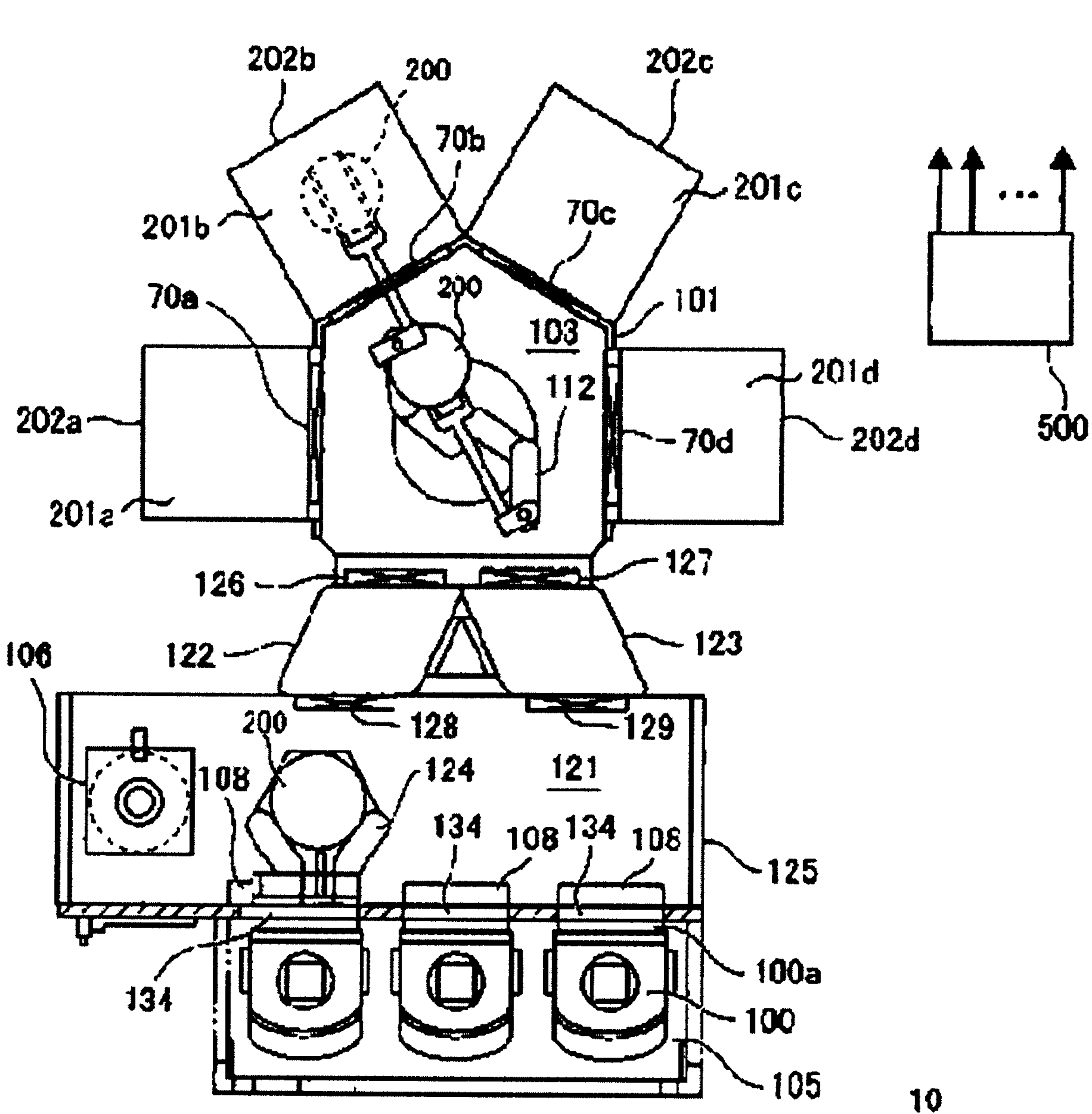
FIG. 1 is a diagram schematically illustrating a horizontal cross-section of a substrate processing apparatus according to one or more embodiments of the present disclosure.

Hereinafter, one or more embodiments (also simply referred to as "embodiments") of the technique of the present disclosure will be described in detail mainly with reference to FIGS. 1 through 5. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

FIG. 1 is a diagram schematically illustrating a horizontal cross-section of a substrate processing apparatus 10 when viewed from above. The substrate processing apparatus 10 is configured to perform a method of manufacturing a semiconductor device. The substrate processing apparatus 10 is a cluster type apparatus, and a transfer structure of the substrate processing apparatus 10 may include a vacuum transfer structure and an atmospheric transfer structure. In addition, in the substrate processing apparatus 10, a FOUP (Front Opening Unified Pod, hereinafter, also referred to as a "pod") 100 may be used as a carrier when a wafer 200 serving as a substrate is transferred.

<Configuration of Vacuum Side>

As shown in FIG. 1, the substrate processing apparatus 10 includes a first transfer chamber 103 capable of withstanding a pressure (negative pressure) below an atmospheric pressure such as a pressure in a vacuum state. For example, a housing 101 of the first transfer chamber 103 is pentagonal when viewed from above. For example, the housing 101 of the first transfer chamber 103 is of a box shape with closed upper and lower ends.

A first substrate transfer structure (which is a first substrate transfer device) 112 capable of transferring the wafer 200 is provided in the first transfer chamber 103.

Load lock chambers 122 and 123 are connected to a side wall among five sidewalls of the housing 101 that is located on a front portion (which is a lower portion in FIG. 1) of the housing 101 via gate valves 126 and 127, respectively. The load lock chamber 123 may also serve as a waiting chamber (also referred to as a "stand-by chamber"). The load lock chambers 122 and 123 will be described in detail later. The load lock chambers 122 and 123 are capable of withstanding the negative pressure. The wafer 200 not only can be transferred (loaded) into or transferred (unloaded) out of each of the load lock chambers 122 and 123 but also can stand by in the each of the load lock chambers 122 and 123.

Process vessels 202*a*, 202*b*, 202*c* and 202*d* (which are configured to perform desired processes on the wafer 200, respectively) are located adjacent to and connected to the four sidewalls (among the five sidewalls) of the housing 101 that are located on a rear portion (back portion) (which is an upper portion in FIG. 1) of the housing 101 of the first transfer chamber 103 with gate valves 70*a*, 70*b*, 70*c* and 70*d* interposed therebetween, respectively.

<Configuration of Atmospheric Side>

A second transfer chamber 121 in which the wafer 200 can be transferred in the atmospheric pressure is connected to each of front portions of the load lock chambers 122 and 123 via gate valves 128 and 129. A second substrate transfer structure (which is a second substrate transfer device) 124 capable of transferring the wafer 200 is provided in the second transfer chamber 121.

A notch aligner 106 is provided at a left portion of the second transfer chamber 121. For example, the notch aligner 106 is configured as an orientation flat aligner.

A substrate loading/unloading port 134 and a pod opener 108 are provided at a front portion of a housing 125 of the second transfer chamber 121 such that the wafer 200 can be loaded into or unloaded out of the second transfer chamber 121 through the substrate loading/unloading port 134. A loading port structure (which is an I/O stage) 105 is provided opposite to the pod opener 108 with the substrate loading/unloading port 134 interposed therebetween. That is, the loading port structure 105 is installed outside the housing 125. The pod opener 108 is configured to open and close a cap 100*a* of the pod 100. The pod opener 108 is provided with a closure (not shown) capable of opening and closing the substrate loading/unloading port 134. When the cap 100*a* of the pod 100 placed on the loading port structure 105 is opened or closed, the wafer 200 may be loaded into the pod 100 or unloaded out of the pod 100. In addition, the pod 100 is loaded onto or unloaded out of the loading port structure 105 by an in-step transfer device (not shown) such as an OHT (Overhead Hoist Transfer).

<Configuration of Process Vessel>

Process chambers 201*a*, 201*b*, 201*c* and 201*d* are provided in the process vessels 202*a*, 202*b*, 202*c* and 202*d*, respectively. The process chambers 201*a*, 201*b*, 201*c* and 201*d* are configured to communicate with one another in a decompressed state (that is, in the negative pressure) via the gate valves 70*a*, 70*b*, 70*c* and 70*d* and the first transfer chamber 103. Processes set in advance are performed on the wafer (or wafers) 200 loaded into each of the process chambers 201*a*, 201*b*, 201*c* and 201*d*. That is, different processes are performed on the wafer (or wafers) 200 respectively in the process vessels 202*a*, 202*b*, 202*c* and 202*d*.

As each of the process vessels 202*a*, 202*b*, 202*c* and 202*d*, a single wafer type substrate processing apparatus or a batch type substrate processing apparatus may be used. That is, one or more single wafer type substrate processing apparatuses and one or more batch type substrate processing apparatuses may be provided as the process vessels 202*a*, 202*b*, 202*c* and 202*d*. The single wafer type substrate processing apparatus is provided with a single wafer type process chamber in which a single wafer type process is performed on one or several wafers 200 at a time. The batch type substrate processing apparatus is provided with a batch type process chamber in which a batch type process is performed on a plurality of wafers including the wafer 200 simultaneously. Hereinafter, the plurality of wafers including the wafer 200 may also be simply referred to as a "plurality of wafers 200". That is, as each of the process chambers 201*a*, 201*b*, 201*c* and 201*d*, the single wafer type process chamber or the batch type process chamber may be used. That is, one or more single wafer type process chambers and one or more batch type process chambers may be provided as the process chambers 201*a*, 201*b*, 201*c* and 201*d*.

<Configuration of Load Lock Chamber>

Subsequently, the load lock chambers 122 and 123 will be described. The load lock chambers 122 and 123 are provided adjacent to each other with respect to one surface of the first transfer chamber 103 provided at the vacuum side of the substrate processing apparatus 10 via the gate valves 126 and 127, respectively. Further, the load lock chambers 122 and 123 are provided adjacent each other with respect to one surface of the second transfer chamber 121 provided at the atmospheric side of the substrate processing apparatus 10 via the gate valves 128 and 129, respectively. The load lock chambers 122 and 123 are configured to communicate with the process chambers 201*a*, 201*b*, 201*c* and 201*d* in the decompressed state via the gate valves 126 and 127 and the first transfer chamber 103. That is, the load lock chambers 122 and 123 can communicate with the first transfer chamber 103 in the decompressed state via the gate valves 126 and 127. Further, the load lock chambers 122 and 123 are configured to communicate with the second transfer chamber 121 in the atmospheric pressure via the gate valves 128 and 129.

In the load lock chamber 122, an unprocessed wafer 200 before being transferred to one of the process chambers 201*a*, 201*b*, 201*c* and 201*d* is stored. Further, in the load lock chamber 123, a processed wafer 200 after being processed in at least one of the process chambers 201*a*, 201*b*, 201*c* and 201*d* is stored. That is, each of the load lock chambers 122 and 123 is configured as a storage chamber in which the unprocessed wafer 200 (which is unprocessed) or the processed wafer 200 (which is processed) is temporarily stored.

Figure 2A:
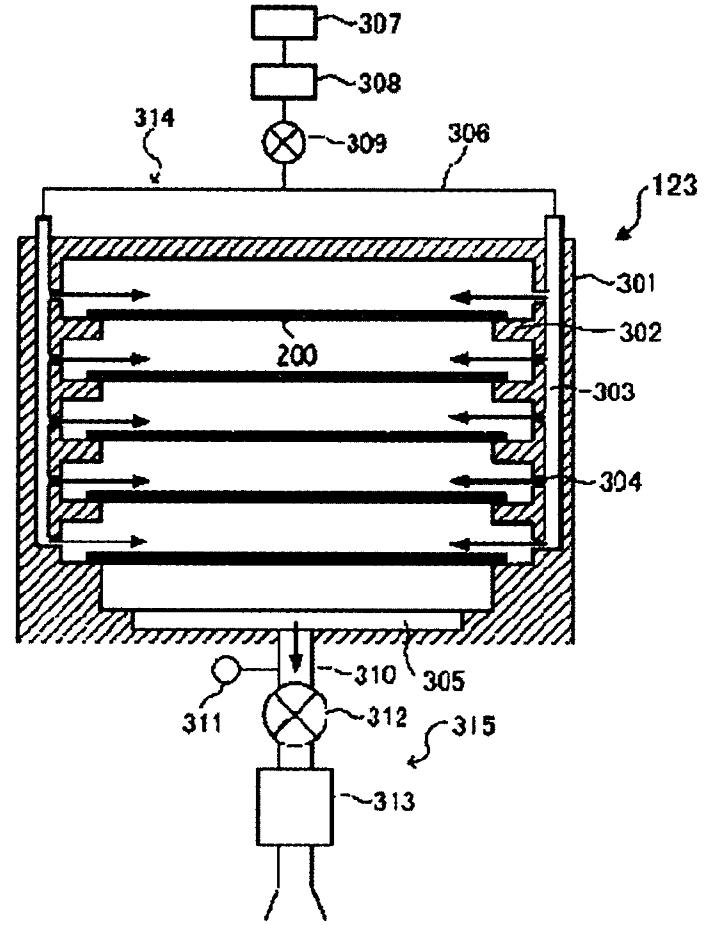
FIG. 2A is a diagram schematically illustrating an example of a vertical cross-section of a waiting chamber of the substrate processing apparatus according to the embodiments of the present disclosure.
Figure 2B:
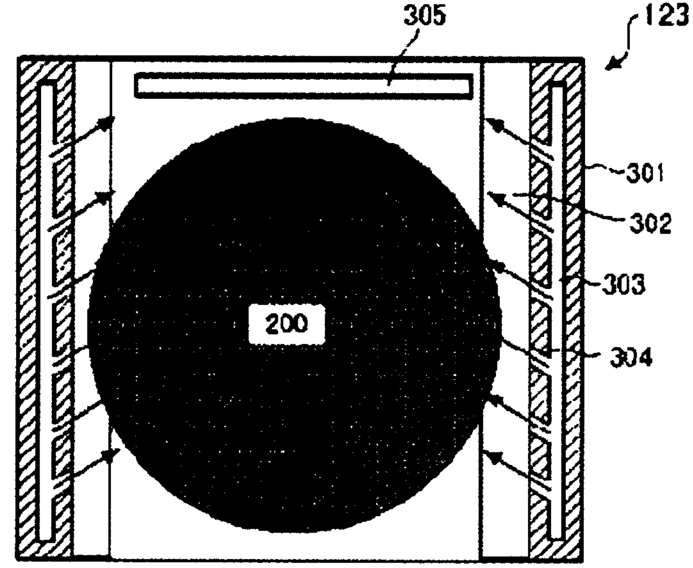
FIG. 2B is a diagram schematically illustrating an example of a horizontal cross-section of the waiting chamber of the substrate processing apparatus according to the embodiments of the present disclosure.

FIG. 2A and FIG. 2B are diagrams schematically illustrating an example of the load lock chamber 123.

The load lock chamber 123 is used as the waiting chamber in which the wafer 200 after processed in at least one among the process vessels 202*a*, 202*b*, 202*c* and 202*d* is in stand-by before a subsequent process is performed on the wafer 200. For example, the load lock chamber 123 includes: a housing 301; a plurality of supports (which are support structures) 302 capable of vertically supporting a plurality of wafers 200, respectively, in a substantially horizontal orientation in the housing 301; an inert gas flow path 303 through which an inert gas is supplied; and a plurality of inert gas supply ports 304 through which the inert gas is supplied into the housing 301. Hereinafter, a support among the plurality of supports 302 may also be referred to as a "support 302".

As shown in FIG. 2A, the inert gas flow path 303 is provided in a vertical direction on both side walls of the housing 301. The inert gas supply ports 304 are provided at heights corresponding to the plurality of wafers 200 in the load lock chamber 123, respectively. The inert gas supply ports 304 are provided in a substantially horizontal orientation and arranged along the vertical direction. The inert gas supply ports 304 are provided such that the inert gas flow path 303 can communicate with an inside of the load lock chamber 123.

Further, as shown in FIG. 2B, the inert gas supply ports 304 are provided in a width direction of the load lock chamber 123. In addition, the inert gas supply ports 304 extend obliquely toward an exhaust port 305 rather than toward a center of the wafer 200. That is, the inert gas flowing through the inert gas flow path 303 is supplied from both edges (side portions) of each of the plurality of wafers 200 substantially horizontally with respect to a surface of each of the plurality of wafers 200.

An inert gas supply pipe 306 is connected to the inert gas flow path 303. An inert gas supply source 307, a mass flow controller (MFC) 308 serving as a flow rate controller (flow rate control structure) and a valve 309 serving as an opening/closing valve are sequentially provided in this order at the inert gas supply pipe 306 from an upstream side toward a downstream side of the inert gas supply pipe 306 in a gas flow direction. An inert gas supplier (which is an inert gas supply system or an inert gas supply structure") 314 is constituted mainly by the inert gas supply pipe 306, the MFC 308 and the valve 309. The inert gas supplier 314 may further include the inert gas supply source 307.

The inert gas is supplied into the load lock chamber 123 through the inert gas supply pipe 306 via the inert gas flow path 303 and the inert gas supply ports 304. The inert gas acts as a purge gas.

The exhaust port 305 through which an inner atmosphere of the load lock chamber 123 is exhausted is provided on a bottom surface of the housing 301 at a location adjacent to the first transfer chamber 103. That is, the exhaust port 305 is configured such that the inert gas supplied into the load lock chamber 123 is exhausted through the exhaust port 305. As a result, it is possible for the inert gas (which is supplied to a surface of the wafer 200) to flow without stagnating on the surface of the wafer 200. Further, it is possible to suppress a re-adhesion (re-attachment) of particles onto the wafer 200 (which is in stand-by in the load lock chamber 123). Alternatively, the exhaust port 305 may be provided at other location such as on a lower portion of a side surface of the housing 301 or on a center of the bottom surface of the housing 301.

An exhaust pipe 310 is connected to the exhaust port 305. A vacuum pump 313 serving as a vacuum exhaust apparatus is connected to the exhaust pipe 310 through a pressure sensor 311 and an APC (Automatic Pressure Controller) valve 312. The pressure sensor 311 serves as a pressure detector (which is a pressure detection structure) to detect an inner pressure of the housing 301, and the APC valve 312 serves as a pressure regulator (which is a pressure adjusting structure). With the vacuum pump 313 in operation, the APC valve 312 may be opened or closed to perform a vacuum exhaust of the housing 301 or stop the vacuum exhaust of the housing 301. Further, with the vacuum pump 313 in operation, an opening degree of the APC valve 312 may be adjusted based on pressure information detected by the pressure sensor 311, so as to control (or adjust) the inner pressure of the housing 301. An exhauster (which is an exhaust structure or an exhaust system) 315 is constituted mainly by the exhaust pipe 310, the APC valve 312 and the pressure sensor 311. The exhauster 315 may further include the vacuum pump 313.

The load lock chamber 123 is configured such that the plurality of wafers 200 are supported by the plurality of supports 302, respectively, along the vertical direction while the plurality of wafers 200 are horizontally oriented with their centers aligned with one another in a multistage manner. That is, the plurality of wafers 200 are arranged with a predetermined interval therebetween in the load lock chamber 123. For example, the housing 301 and the supports 302 may be provided integrally as a single body. For example, each of the housing 301 and the supports 302 may be made of a heat resistant material such as quartz and silicon carbide (SiC).

The load lock chamber 123 is used as the waiting chamber in which the wafer 200 is in stand-by. For example, in the load lock chamber 123, the wafer 200 after processed in one of the process chambers 201_a_, 201_b_, 201_c_ and 201_d_ is placed on the support 302 to be in stand-by. The present embodiments are described by way of an example in which the inert gas supply ports 304 are provided for slots (that is, for the plurality of wafers 200), respectively, and the inert gas is supplied to each of the plurality of wafers 200 placed on the supports 302. However, the present embodiments are not limited thereto. For example, the inert gas supply ports 304 may be provided for every predetermined number of slots (that is, for every predetermined number of wafers), and the inert gas may be supplied to the wafers 200 in stand-by (that is, the inert gas may be supplied to every predetermined number of wafers among the plurality of wafers 200). For example, the inert gas may be supplied for every two slots or every three slots.

(2) Configuration of Controller

Subsequently, a configuration of a controller 500 serving as a control apparatus (control structure) will be described.

The controller 500 controls components (which are described above) constituting the substrate processing apparatus 10 to perform a substrate processing described later.

Figure 3:
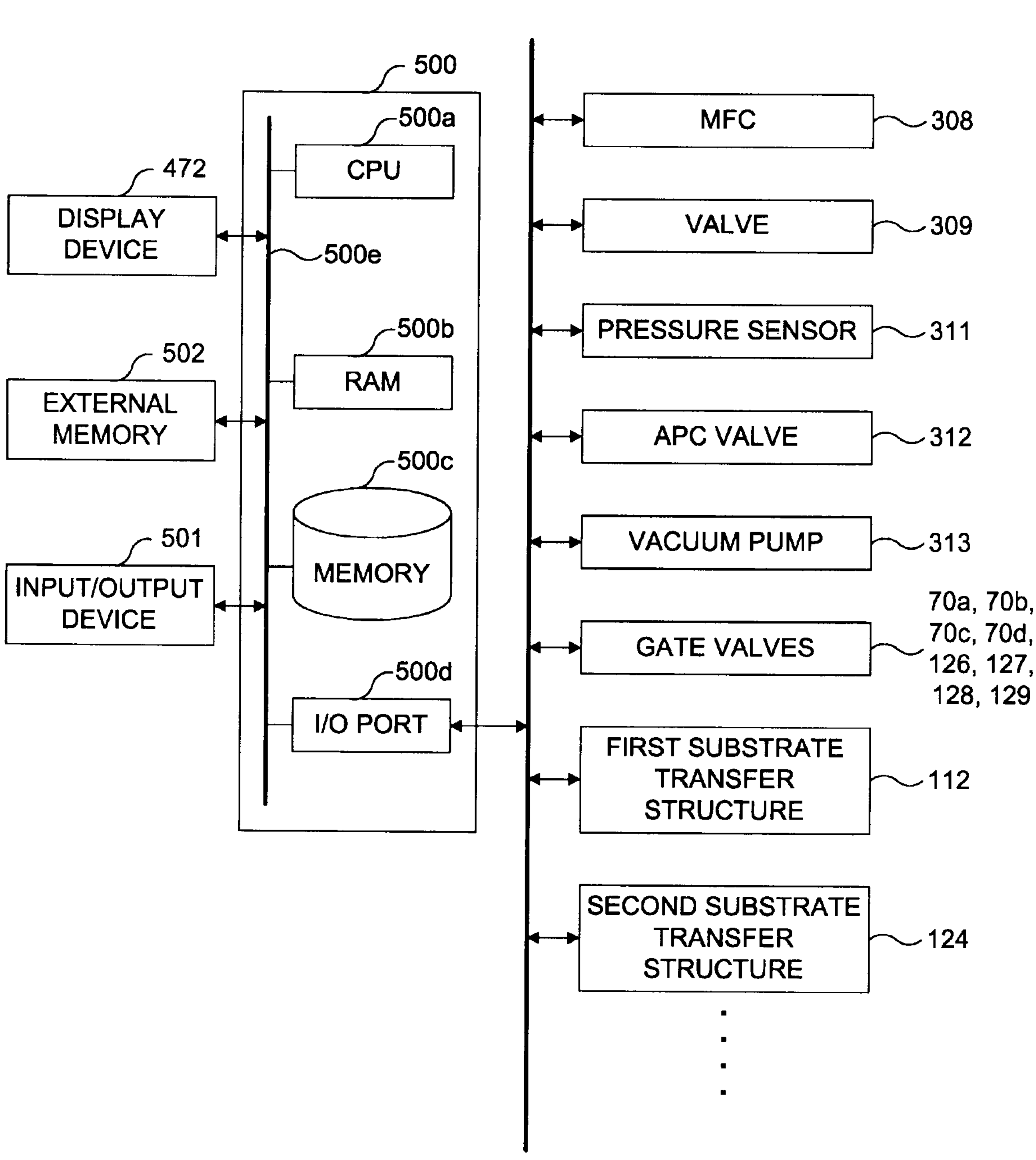
FIG. 3 is a block diagram schematically illustrating an example of a configuration of a controller and related components of the substrate processing apparatus according to the embodiments of the present disclosure.

As shown in FIG. 3, the controller 500 is constituted by a computer including a CPU (Central Processing Unit) 500_a_, a RAM (Random Access Memory) 500_b_, a memory 500_c_ and an I/O port (input/output port) 500_d_. The RAM 500_b_, the memory 500_c_ and the I/O port 500_d_ may exchange data with the CPU 500_a_ through an internal bus 500_e_. For example, an input/output device 501 constituted by components such as a touch panel and a display device 472 such as a display may be connected to the controller 500.

The memory 500_c_ is configured by a component such as a flash memory and a hard disk drive (HDD). For example, a control program configured to control operations of the substrate processing apparatus 10 or a process recipe containing information on process sequences and process conditions of the substrate processing described later may be readably stored in the memory 500_c_. The process recipe is obtained by combining steps of the substrate processing described later such that the controller 500 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to both of the process recipe and the control program. Further, the RAM 500_b_ functions as a memory area (work area) where a program or data read by the CPU 500_a_ is temporarily stored.

The I/O port 500_d_ is connected to the above-described components such as the MFC 308, the valve 309, the pressure sensor 311, the APC valve 312, the vacuum pump 313, the gate valves 70_a_, 70_b_, 70_c_, 70_d_, 126, 127, 128 and 129, the first substrate transfer structure 112 and the second substrate transfer structure 124.

The CPU 500_a_ is configured to read the control program from the memory 500_c_ and execute the read control program. In addition, the CPU 500_a_ is configured to read the process recipe from the memory 500_c_ in accordance with an operation command inputted from the input/output device 501. In accordance with the contents of the read process recipe, the CPU 500_a_ may be configured to be capable of controlling various operations such as a transfer operation for the wafer 200 (which is a substrate transfer operation) by the first substrate transfer structure 112 or the second substrate transfer structure 124, a supply and discharge operation for the inert gas by the MFC 308, the valve 309, the pressure sensor 311, the APC valve 312 and the vacuum pump 313 in the load lock chamber 123, a vacuum exhaust operation, a temperature elevating and lowering operation by a heater in each of the process vessels 202*a*, 202*b*, 202*c* and 202*d*, a pressure adjusting operation by an APC valve (not shown) and a flow rate adjusting operation for a gas by an MFC (not shown) and a valve (not shown).

The controller 500 is not limited to a dedicated computer, and may be embodied by a general-purpose computer. For example, the controller 500 may be embodied by preparing an external memory 502 (for example, a magnetic tape, a magnetic disk such as a flexible disk and a hard disk, an optical disk such as a CD and a DVD, a magneto-optical disk such as an MO, a semiconductor memory such as a USB memory (that is, a USB flash drive) and a memory card) where the program described above is stored and installing the program onto the general-purpose computer by using the external memory 502. A method of providing the program to the computer is not limited to using the external memory 502. For example, the program may be supplied to the computer (general-purpose computer) by using a communication structure such as the Internet and a dedicated line instead of the external memory 502. Further, the memory 500*c* or the external memory 502 may be embodied by a non-transitory computer readable recording medium. Hereafter, the memory 500*c* and the external memory 502 may be collectively or individually referred to as a "recording medium". Thus, in the present specification, the term "recording medium" may refer to the memory 500*c* alone, may refer to the external memory 502 alone or may refer to both of the memory 500*c* and the external memory 502.

(5) Substrate Processing

Figure 5:
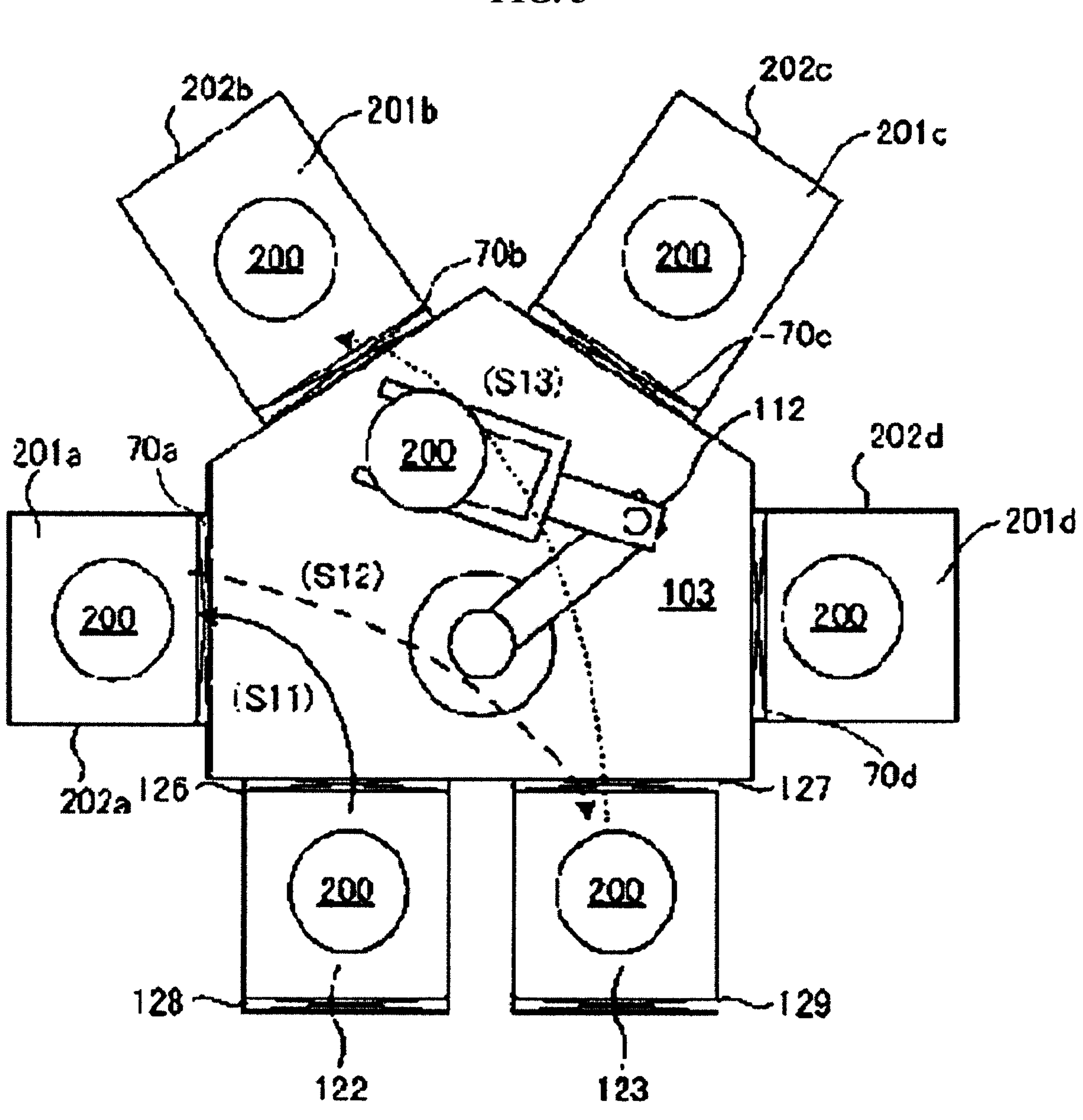
FIG. 5 is a diagram schematically illustrating examples of operations of the substrate processing apparatus according to the embodiments of the present disclosure.

Hereinafter, as a part of a manufacturing process of a semiconductor device, the substrate processing from a start of a process on the wafer 200 in the process vessel 202*a* to an end of a process on the wafer 200 in the process vessel 202*d* will be described with reference to FIGS. 4 and 5. The substrate processing is performed by using the substrate processing apparatus 10. For example, in the following descriptions, operations of the components constituting the substrate processing apparatus 10 are controlled by the controller 500. As described above, different processes are performed respectively in the process vessels 202*a*, 202*b*, 202*c* and 202*d*.

<First Process: S11>

First, an unprocessed wafer 200 stored in the load lock chamber 122 is transferred (loaded) into the process chamber 201*a* of the process vessel 202*a* by using the first substrate transfer structure 112. After the wafer 200 is loaded into the process chamber 201*a*, the first substrate transfer structure 112 is retracted to an outside of the process vessel 202*a*, and the gate valve 70*a* is closed to seal (close) an inside of the process vessel 202*a* airtightly (hermetically). Then, a first process is performed on the wafer 200 in the process chamber 201*a*.

<Waiting Step: S12>

Subsequently, the gate valve 70*a* is opened such that the process chamber 201*a* and the first transfer chamber 103 communicate with each other. Then, when the process vessel 202*b* in which a second process (which is to be performed on the wafer 200 after the first process) is performed is in use, the wafer 200 after the first process is performed thereon is transferred from the process chamber 201*a* to the load lock chamber 123 by using the first substrate transfer structure 112. Then, the wafer 200 is placed on the support 302. Then, the wafer 200 after the first process is performed thereon is in stand-by until a processing (that is, the second process onto another wafer) in the process vessel 202*b* is completed. According to the present embodiments, in a case where the process vessel 202*a* is configured as the single wafer type substrate processing apparatus, every time after the single wafer type process is performed on the wafer (or several wafers) 200, the wafer (or several wafers) 200 is (or are) placed on the support 302 (or on several supports among the supports 302) to be in stand-by. Thereby, it is possible to process a subsequent wafer (or subsequent several wafers) 200 in the process vessel 202*a* which is empty by unloading the wafer (or several wafers) 200 therefrom. Further, in a case where the process vessel 202*a* is configured as the batch type substrate processing apparatus, after the batch process is performed simultaneously on the plurality of wafers 200 in the process vessel 202*a*, the plurality of wafers 200 are placed on the supports 302 to be in stand-by.

In the present step, the inert gas is supplied into the load lock chamber 123. Specifically, the valve 309 and the APC valve 312 are opened such that, by controlling the MFC 308, the inert gas is supplied to the wafer 200 on the support 302 in the load lock chamber 123 through the inert gas supply pipe 306 via the inert gas flow path 303 and the inert gas supply ports 304. In the present step, the inner pressure of the housing 301 is controlled (or adjusted) to a predetermined pressure in the decompressed state.

Then, the APC valve 312 adjusts a conductance of the exhaust pipe 310 so as to control a flow rate of the inert gas exhausted from the load lock chamber 123 by the vacuum pump 313 such that an inner pressure of the load lock chamber 123 is maintained at a predetermined pressure. As a result, the inert gas in the load lock chamber 123 is removed from the load lock chamber 123 through the exhaust port 305 and the exhaust pipe 310 by the vacuum pump 313.

In a manner described above, in the load lock chamber 123, the inert gas is supplied to the wafer 200 in stand-by on the support 302 in the decompressed state. Since operations of components (which are described in the present step) in a waiting step S14 and a waiting step S16 described later are substantially the same as those of the components in the present step (that is, the waiting step S12), detailed descriptions thereof will be omitted in the following descriptions.

<Second Process: S13>

Subsequently, when a previous processing in the process vessel 202*b* is completed and the process vessel 202*b* is usable, the wafer 200 (on which the first process is completed) in stand-by in the load lock chamber 123 is transferred (loaded) into the process chamber 201*b* by using the first substrate transfer structure 112. After the wafer 200 is loaded into the process chamber 201*b*, the first substrate transfer structure 112 is retracted to an outside of the process vessel 202*b*, and the gate valve 70*b* is closed to seal (close) an inside of the process vessel 202*b* airtightly (hermetically). Then, the second process is performed on the wafer 200 in the process chamber 201*b*.

<Waiting Step: S14>

Subsequently, the gate valve 70*b* is opened such that the process chamber 201*b* and the first transfer chamber 103 communicate with each other. Then, when the process chamber 202*c* in which a third process (which is to be performed on the wafer 200 after the second process) is performed is in use, the wafer 200 after the second process is performed thereon is transferred from the process chamber 201*b* to the load lock chamber 123 by using the first substrate transfer structure 112. Then, the wafer 200 is placed on the support 302. Then, the wafer 200 after the second process is performed thereon is in stand-by while supplying and exhausting the inert gas until a processing (that is, the third process onto another wafer) in the process vessel 202*c* is completed.

<Third Process: S15>

Subsequently, when a previous processing in the process vessel 202*c* is completed and the process vessel 202*c* is usable, the wafer 200 (on which the second process is completed) in stand-by in the load lock chamber 123 is transferred (loaded) into the process chamber 201*c* by using the first substrate transfer structure 112. After the wafer 200 is loaded into the process chamber 201*c*, the first substrate transfer structure 112 is retracted to an outside of the process vessel 202*c*, and the gate valve 70*c* is closed to seal (close) an inside of the process vessel 202*c* airtightly (hermetically). Then, the third process is performed on the wafer 200 in the process chamber 201*c*.

<Waiting Step: S16>

Subsequently, the gate valve 70*c* is opened such that the process chamber 201*c* and the first transfer chamber 103 communicate with each other. Then, when the process chamber 202*d* in which a fourth process (which is to be performed on the wafer 200 after the third process) is performed is in use, the wafer 200 after the third process is performed thereon is transferred from the process chamber 201*c* to the load lock chamber 123 by using the first substrate transfer structure 112. Then, the wafer 200 is placed on the support 302. Then, the wafer 200 after the third process is performed thereon is in stand-by while supplying and exhausting the inert gas until a processing (that is, the fourth process onto another wafer) in the process vessel 202*d* is completed.

<Fourth Process: S17>

Subsequently, when a previous processing in the process vessel 202*d* is completed and the process vessel 202*d* is usable, the wafer 200 (on which the third process is completed) in stand-by in the load lock chamber 123 is transferred (loaded) into the process chamber 201*d* by using the first substrate transfer structure 112. After the wafer 200 is loaded into the process chamber 201*d*, the first substrate transfer structure 112 is retracted to an outside of the process vessel 202*d*, and the gate valve 70*d* is closed to seal (close) an inside of the process vessel 202*d* airtightly (hermetically). Then, the fourth process is performed on the wafer 200 in the process chamber 201*d*.

After the fourth process is performed, the gate valve 70*d* is opened such that the process chamber 201*d* and the first transfer chamber 103 communicate with each other. Then, the wafer 200 after the fourth process is performed thereon is transferred from the process chamber 201*d* to the load lock chamber 123 by using the first substrate transfer structure 112. Thereafter, after the gate valve 70*d* is closed, the gate valve 129 is opened such that the load lock chamber 123 and the second transfer chamber 121 communicate with each other. Then, the wafer 200 after the first process through the fourth process are performed thereon is transferred (unloaded) out of the load lock chamber 123 by using the second substrate transfer structure 124.

When a plurality of processes such as the first process through the fourth process are performed on the wafer 200 by using a plurality of process chambers such as the process chambers 201*a*, 201*b*, 201*c* and 201*d*, a waiting time (also referred to as a "stand-by time") may occur between a process completed on the wafer 200 and its subsequent process to be performed on the wafer 200. However, according to the present embodiments, by temporarily storing the wafer 200 (after the process is completed) in stand-by in the load lock chamber 123, it is possible to eliminate a stand-by state of the first substrate transfer structure 112 to thereby make it possible to use a process vessel in an empty state. Therefore, it is possible to perform the substrate processing smoothly, and it is also possible to improve a throughput. Further, by supplying the inert gas to the surface of the wafer 200 in stand-by in the decompressed state in the load lock chamber 123, it is possible to suppress an oxidation or the like of the surface of the wafer 200 in stand-by, and it is also possible to suppress an adhesion of the particles to the surface of the wafer 200.

<Other Embodiments (Modified Examples) of Present Disclosure>

While the technique of the present disclosure is described in detail by way of the embodiments described above, the technique of the present disclosure is not limited thereto. The technique of the present disclosure may be modified in various ways without departing from the scope thereof.

For example, the embodiments described above are described by way of an example in which the processes are sequentially performed on the wafer 200 in the process vessels 202*a*, 202*b*, 202*c* and 202*d* in this order. However, the technique of the present disclosure is not limited thereto. That is, the order or the number of times of performing the processes may not be particularly limited. For example, the technique of the present disclosure may also be applied in a case where the processes are performed on the wafer 200 by using at least two process vessels. Even in such a modified example, it is possible to obtain substantially the same effects as those of the embodiments described above.

For example, the embodiments described above are described by way of an example in which the load lock chamber 123 is used as the waiting chamber. However, the technique of the present disclosure is not limited thereto. That is, the load lock chamber 122 may be used as the waiting chamber or the waiting chamber may be provided separately from the load lock chambers 122 and 123. Even in such modified examples, it is possible to obtain substantially the same effects as those of the embodiments described above.

For example, the embodiments described above are described by way of an example in which the exhaust port 305 through which the inert gas of the load lock chamber 123 (that is, the inner atmosphere of the load lock chamber 123) is exhausted is provided on a bottom surface of the load lock chamber 123 (that is, the bottom surface of the housing 301) at the location adjacent to the first transfer chamber 103 or provided on a lower portion of a side surface of the load lock chamber 123 (that is, on the lower portion of the side surface of the housing 301). However, the technique of the present disclosure is not limited thereto. That is, the exhaust port 305 may be provided on the bottom surface of the load lock chamber 123 at a location adjacent to the second transfer chamber 121 or provided on an upper surface of the load lock chamber 123. Even in such modified examples, it is possible to obtain substantially the same effects as those of the embodiments described above.

It is preferable that recipes used in the processes are prepared individually in accordance with contents of the processes and stored in the memory 500*c* via an electric communication line or the external memory 502. When starting each process, it is preferable that the CPU 500*a* selects an appropriate recipe among the recipes stored in the memory 500*c* in accordance with the contents of each process. Thus, various films of different composition ratios, qualities and thicknesses can be formed in a reproducible manner and in a universal manner by using a single substrate processing apparatus (that is, the substrate processing apparatus 10). In addition, since a burden on an operating personnel of the substrate processing apparatus 10 can be reduced, various processes can be performed quickly while avoiding a malfunction of the substrate processing apparatus 10.

The recipe described above is not limited to creating a new recipe. For example, the recipe may be prepared by changing an existing recipe stored (or installed) in the substrate processing apparatus 10 in advance. When changing the existing recipe to a new recipe, the new recipe may be installed in the substrate processing apparatus 10 via the electric communication line or the recording medium in which the new recipe is stored. Further, the existing recipe already stored in the substrate processing apparatus 10 may be directly changed to the new recipe by operating the input/output device 501 of the substrate processing apparatus 10.

For example, the embodiments described above are described by way of an example in which one or more single wafer type process chambers and one or more batch type process chambers are provided as the process chambers 201*a*, 201*b*, 201*c* and 201*d*. However, the technique of the present disclosure is not limited thereto. For example, instead of providing the one or more single wafer type process chambers and one or more batch type process chambers as the process chambers 201*a*, 201*b*, 201*c* and 201*d*, the technique of the present disclosure may also be applied when the single wafer type process chambers are provided as the process chambers 201*a*, 201*b*, 201*c* and 201*d* or when the batch type process chambers are provided as the process chambers 201*a*, 201*b*, 201*c* and 201*d*. Further, as each of the process vessels 202*a*, 202*b*, 202*c* and 202*d*, a substrate processing apparatus provided with a hot wall type process furnace, a substrate processing apparatus provided with a cold wall type process furnace or other substrate processing apparatuses may be used.

Process sequences and process conditions of each process using the substrate processing apparatuses described above may be substantially the same as those of the embodiments described above. Even in such a case, it is possible to obtain substantially the same effects as those of the embodiments described above.

Further, the embodiments described above and modified examples described above may be appropriately combined. In addition, process sequences and process conditions of each combination thereof may be substantially the same as those of the embodiments described above.

According to some embodiments of the present disclosure, it is possible to improve the throughput and suppress the oxidation of the surface of the substrate and the adhesion of the particles to the surface of the substrate.

What is claimed is:

1. A substrate processing apparatus comprising:

a plurality of process chambers in which a substrate transferred thereinto is processed, wherein a plurality of processes respectively set in advance for the plurality of process chambers are performed on the substrate;

a first transfer chamber provided adjacent to the plurality of process chambers and maintained in a decompressed state;

a waiting chamber capable of communicating with the first transfer chamber in the decompressed state, provided with a plurality of supports capable of supporting a plurality of substrates comprising the substrate after a process set for a first process chamber among the plurality of process chambers is completed;

a second transfer chamber maintained in an atmospheric state and capable of communicating with the waiting chamber at a side different from where the waiting chamber communicates with the first transfer chamber;

an exhaust port through which an inert gas is exhausted is provided on a bottom surface of the waiting chamber or on a lower portion of a side surface of the waiting chamber; and a plurality of inert gas supply ports provided along a width direction and along a vertical direction at both opposing sides of the waiting chamber and extending obliquely toward the exhaust port rather than toward a center of each of the plurality of substrates respectively supported by the plurality of supports, and configured to supply the inert gas onto surfaces of the plurality of substrates respectively supported by the plurality of supports.

2. The substrate processing apparatus of claim 1, wherein the plurality of processes respectively set for the plurality of process chambers are different from one another.

3. The substrate processing apparatus of claim 1, wherein the substrate in stand-by in the waiting chamber is transferred into a second process chamber among the plurality of process chambers, and a process set for the second process chamber is performed on the substrate transferred into the second process chamber.

4. The substrate processing apparatus of claim 1, wherein the plurality of process chambers comprise one or more single wafer type process chambers and one or more batch type process chambers.

5. A substrate processing method, comprising:

(a) performing a plurality of processes respectively set in advance for a plurality of process chambers on a substrate transferred thereinto; and (b) supplying an inert gas for surfaces of a plurality of substrates comprising the substrate respectively supported by a plurality of supports of a waiting chamber after a process set for a first process chamber among the plurality of process chambers is completed, wherein the waiting chamber communicates with the first transfer chamber in a decompressed state and with a second transfer chamber in an atmospheric state, and the first transfer chamber is provided adjacent to the plurality of process chambers, wherein the inert gas is exhausted through an exhaust port provided on a bottom surface of the waiting chamber or on a lower portion of a side surface of the waiting chamber, and wherein the inert gas is supplied through a plurality of inert gas supply ports provided along a width direction and along a vertical direction at both opposing sides of the waiting chamber and extending obliquely toward the exhaust port rather than toward a center of each of the plurality of substrates respectively supported by the plurality of supports.

6. A non-transitory computer-readable recording medium storing a program that causes a substrate processing apparatus, by a computer, to perform:

(a) performing a plurality of processes respectively set in advance for a plurality of process chambers on a substrate transferred thereinto; and (b) supplying an inert gas for surfaces of a plurality of substrates comprising the substrate respectively supported by a plurality of supports of a waiting chamber after a process set for a first process chamber among the plurality of process chambers is completed, wherein the waiting chamber communicates with the first transfer chamber in a decompressed state and with a second transfer chamber in an atmospheric state, and the first transfer chamber is provided adjacent to the plurality of process chambers, wherein the inert gas is exhausted through an exhaust port provided on a bottom surface of the waiting chamber or on a lower portion of a side surface of the waiting chamber, and wherein the inert gas is supplied through a plurality of inert gas supply ports provided along a width direction and along a vertical direction at both opposing sides of the waiting chamber and extending obliquely toward the exhaust port rather than toward a center of each of the plurality of substrates respectively supported by the plurality of supports.

7. A method of manufacturing a semiconductor device, comprising the method of claim 5.

8. The substrate processing apparatus of claim 1, further comprising:

a transfer device configured to be capable of transferring the plurality of substrates between the first transfer chamber and the plurality of process chambers; and a controller configured to be capable of controlling the transfer device such that, when the process set for the first process chamber is completed and then a processed substrate is transferred from the first process chamber to a second process chamber among the plurality of process chambers, the processed substrate is to be held by one of the plurality of supports in case the second process chamber is in use.

9. The substrate processing apparatus of claim 8, wherein the plurality of supports are configured such that the processed substrate is in standby at the plurality of supports until the second process chamber is in condition for use.

10. The substrate processing apparatus of claim 8, further comprising:

an inert gas supply system configured to be capable of supplying the inert gas into the waiting chamber through the plurality of inert gas supply ports, wherein the controller is further configured to be capable of controlling the inert gas supply system such that the inert gas is continuously supplied into the waiting chamber until the second process chamber is in condition for use.

11. The substrate processing apparatus of claim 8, wherein the controller is further configured to be capable of controlling the transfer device such that the processed substrate is transferred from the waiting chamber to the second process chamber when the second process chamber is in condition for use.

12. The substrate processing apparatus of claim 8, wherein a predetermined number of substrates to be processed in the first process chamber is different from that of substrates to be processed in the second process chamber.

13. The substrate processing apparatus of claim 8, wherein the waiting chamber is interposed between the first transfer chamber in the decompressed state and the second transfer chamber in the atmospheric state.

14. The substrate processing apparatus of claim 8, wherein the controller is further configured to be capable of controlling the transfer device such that a subsequent substrate to be processed in the first process chamber is transferred to the first process chamber in a state where the processed substrate is in standby at the waiting chamber.

15. The substrate processing apparatus of claim 1, wherein the exhaust port is provided at a housing of the waiting chamber located adjacent to the first transfer chamber.

16. The substrate processing apparatus of claim 1, wherein the plurality of inert gas supply ports are provided respectively for the plurality of substrates.

17. The substrate processing apparatus of claim 1, wherein an inert gas supply port is provided for every predetermined number of the substrates.

* * * * *